United States Patent [19]
Hsu

[11] Patent Number: 5,547,389
[45] Date of Patent: Aug. 20, 1996

[54] INTEGRATED CIRCUIT CHIP SOCKET

[76] Inventor: Feng-chien Hsu, 1st Fl., No. 121, Yun Ho St., Ta An Dist., Taipei, Taiwan

[21] Appl. No.: 447,830

[22] Filed: May 23, 1995

[51] Int. Cl.$^6$ ....................................... H01R 4/50
[52] U.S. Cl. ............................. 439/342; 439/487
[58] Field of Search ........................... 439/342, 487, 439/261, 264, 259, 70, 71, 266

[56] References Cited

U.S. PATENT DOCUMENTS

| | | | |
|---|---|---|---|
| 3,904,262 | 9/1975 | Cutchaw | 439/487 |
| 5,241,453 | 8/1993 | Bright et al. | 439/487 |
| 5,256,080 | 10/1993 | Bright | 439/342 |

*Primary Examiner*—P. Austin Bradley
*Assistant Examiner*—Yong K. Kim
*Attorney, Agent, or Firm*—Watson Cole Stevens Davis PLLC

[57] ABSTRACT

A socket for receiving an IC chip having ball-shaped pins is disclosed. The socket includes a base having a plurality of through holes defined therein, a sliding cover housing the base and having a central opening for permitting the IC chip to be inserted therethrough, and an actuating rod located between the base and the cover for causing a sliding movement of the cover relative to the base. Each of said through holes has a contacting leg disposed therein and said leg has a first end extending beyond an upper face of the base and a second end extending through a bottom of the base. Said first end has an arcuate surface which is perpendicular to the sliding movement of the IC chip and has a curvature equal to that of the ball-shaped pin of the IC chip so as to make an electrical surface contact with the ball-shaped pin when the IC chip is moved to be fastened on the base.

4 Claims, 3 Drawing Sheets

INTEGRATED CIRCUIT CHIP SOCKET

BACKGROUND OF THE INVENTION

1. Field of the Invention

The present invention relates to an integrated circuit (IC) chip socket and, more particularly, to a socket for receiving an IC chip having ball-shaped pins.

2. Description of Related Art

Conventionally, an IC chip having ball-shaped pins is directly placed on the circuit board with the ball-shaped pins contacting the circuits and then heating the ball-shaped pins with a special device to solder the chip onto the circuit board. However, in this way, there is a possibility that some of the ball-shaped pins may not be melted, especially the pins located at the central portion, because the pins are subjected to uneven heat during the heating process and thus poor electrical connections are caused.

Therefore, there has been a long and unfulfilled need for a socket for receiving an IC ship having ball-shaped pins which can provide a firm electrical surface contact between the ball-shaped pins and the socket to ensure a perfect electrical connection between the IC chip and the circuit board.

SUMMARY OF THE INVENTION

The present invention provides a socket for an IC chip which has ball-shaped pins and a heat sink affixed thereon. The socket includes a base, a sliding cover housing the base and an actuating rod located between the base and the cover for causing a sliding movement of the cover relative to the base. The cover has a central opening for permitting the IC chip to be inserted therethrough, and an urging element located at one side of the opening which is perpendicular to a direction of the sliding movement of the cover for pushing the heat sink affixed on the IC chip to thereby cause the IC chip to move relative to the base.

The base has a plurality of through holes defined therein and arranged in a form of a matrix aligning with the opening of the cover, and a catching means disposed at one end of the base which is opposite to the urging element for cooperating with the urging element to hold the IC chip in a contacting position. Each of the through holes has a contacting leg disposed therein and the contacting leg has a first end extending beyond an upper face of the base and a second end extending through a bottom surface of the base. Said first end of the contacting leg has an arcuate surface which is perpendicular to the sliding movement of the IC chip and has a curvature equal to that of the ball-shaped pin of the IC chip so as to make an electrical surface contact with the ball-shaped pin when the IC chip is moved to the contacting position.

In accordance with one aspect of the present invention, said contacting leg comprises a bent portion adjacent to said first end thereof for increasing its resiliency to assure said electrical surface contact.

In accordance with another aspect of the present invention, said contacting leg comprises a deflection portion at its second end and each of said through holes comprises a ridge formed at a bottom of a side wall defining said through hole to cooperate with said deflection portion to position the contacting leg.

In accordance with another aspect of the present invention, the base comprises positioning poles located at corners of the bottom surface thereof to position the socket.

Other objects, advantages, and novel features of the invention will become more apparent from the following detailed description when taken in conjunction with the accompanying drawings.

DETAILED DESCRIPTION OF THE PREFERRED EMBODIMENTS

Figure 1:
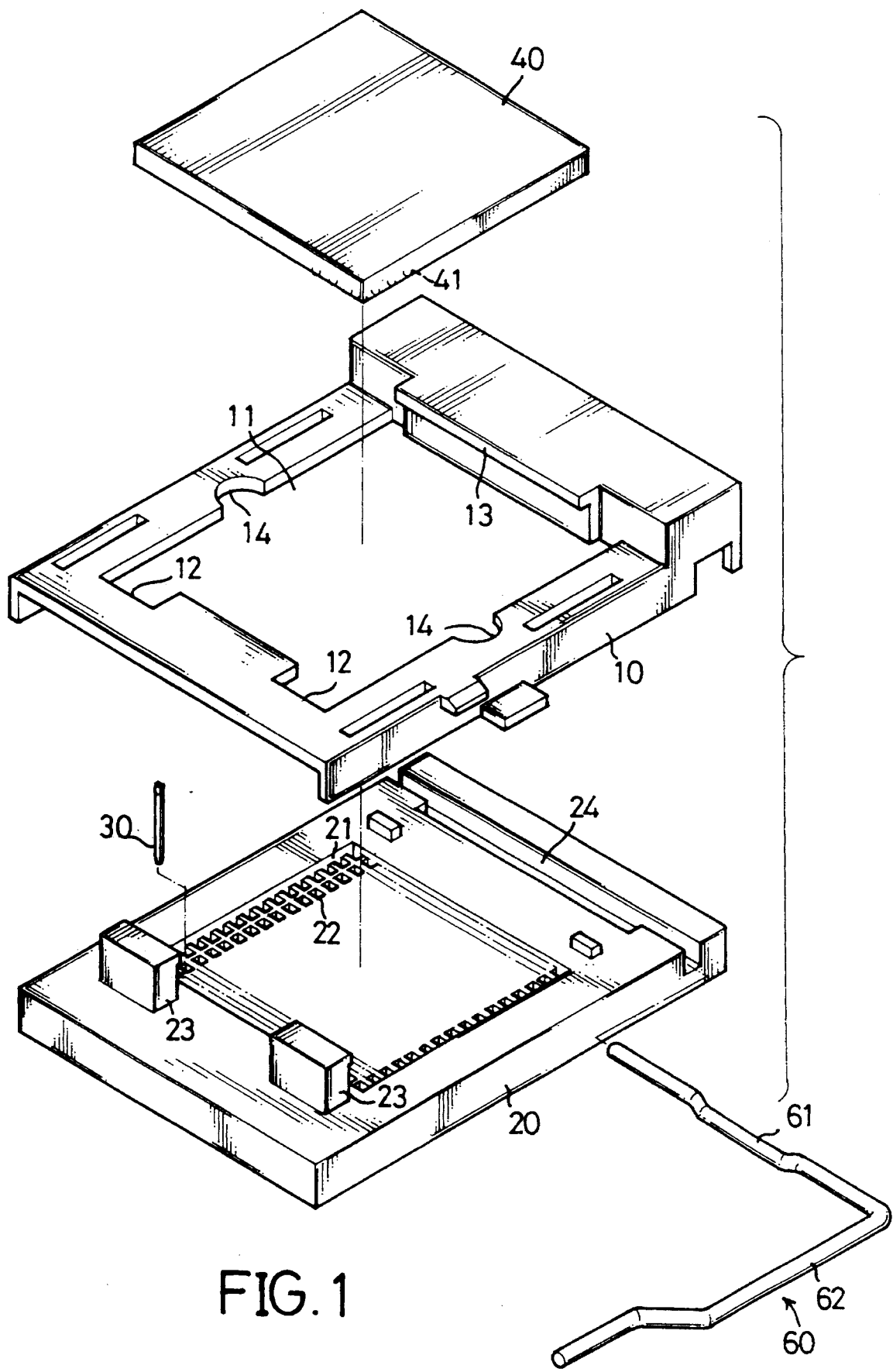
FIG. 1 is an exploded perspective view of a socket for IC chips having ball-shaped pins in accordance with the present invention.

Referring to the drawings and initially to FIG. 1, the socket in accordance with the present invention generally includes a sliding cover 10, a base 20 and an actuating rod 60. The base 20 comprises a central recess 21 having a plurality of through holes 22 defined in a bottom defining the recesses 21, a transverse groove 24 defined in a first end thereof, and a catching means. Each of the through holes 22 has a contacting leg 30 disposed therein. Preferably, the catching means comprises two blocks 23 protruding upward from an upper surface of the base 20 adjacent to a second end of the base 20 and having a substantially inverted L-shaped cross-section.

Preferably, the actuating rod 60 is substantially an L-shaped rod having two arms 61 and 62. The actuating rod 60 is disposed in the base 20 with arm 61 thereof received within the groove 24 of the base 20.

The cover 10 houses the base 20 and has structures to cooperate with the actuating rod 60 such that the cover 10 is slidably movable by the actuating rod 60. Since the structures of the cover 10 to cooperate with the actuating rod 60 are conventional and known in the art, they will not be described in further detail hereinafter. The cover 10 further comprises a central rectangular opening 11 permitting an IC chip 40 which has ball-shaped pins 41 to be inserted therethrough and an urging element 13 located at a first side of the opening 11 which is perpendicular to a direction of the sliding movement of the cover 10 and opposite to the catching blocks 23 of the base 20.

Figures 2, 3:
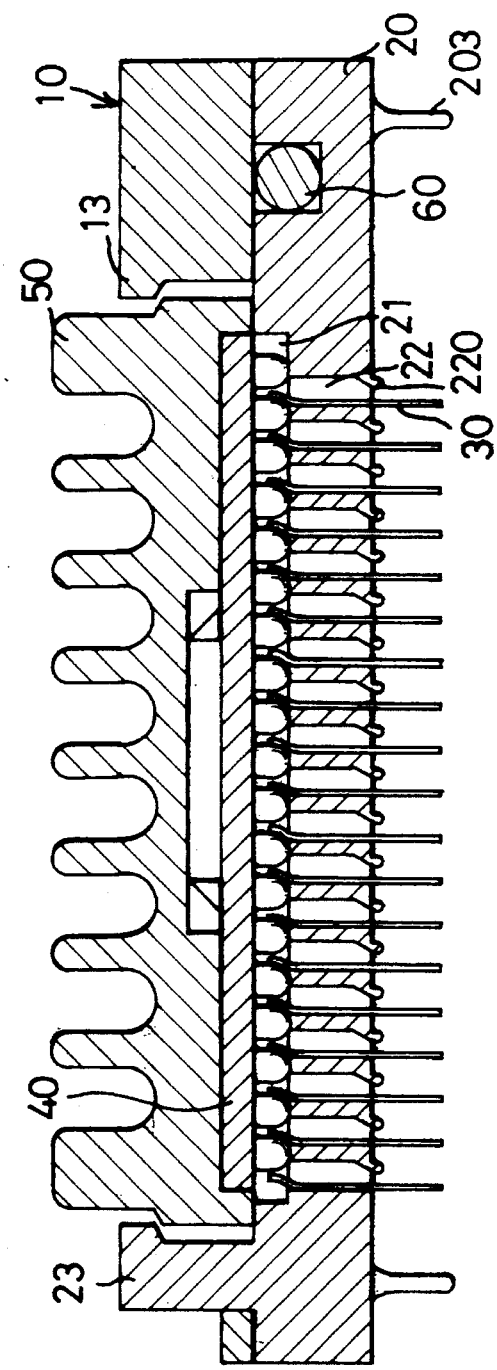
FIG. 2 is an enlarged perspective view of a leg of the socket in accordance with the present invention.
FIG. 3 is a cross-sectional view showing an IC chip having ball-shaped pins inserted in the socket in accordance with the present invention.

Preferably, the urging element 13 is an elongated block having an inverted L-shaped cross-section. The opening 11 preferably has two notches 12 defined in a second side thereof which is opposite to the first side thereof to accommodate the catching blocks 23 of the base 20 and cutouts 14 at the other two sides thereof to facilitate an insertion/removing of the chip 40. Referring to FIG. 2, the contacting leg 30 has an arcuate surface 32 formed at a first end thereof and a bent portion 31 adjacent to the arcuate surface 32.

Referring now to FIG. 3, each of the through holes 22 has a contacting leg 30 disposed therein with the arcuate surface 32 extending into the recess 21 and facing the urging element 13 of the cover 10. The chip 40 has a heat sink 50 attached thereon and is inserted through the opening 11 with the ball-shaped pins 41 received in the recess 21. Preferably, the base 20 comprises four position poles 203 respectively disposed at four corners of a bottom thereof. When the cover 10 is driven by the actuating rod 60 to move toward the catching block 23, the urging block 13 engages with one side of the heat sink 50 and pushes the heat sink 50 and chip 40 to move until an opposite side of said one side of the heat sink 50 engages with the catching blocks 23 of the base 20 and thereby fastening the chip 40 to the socket.

Figure 4:
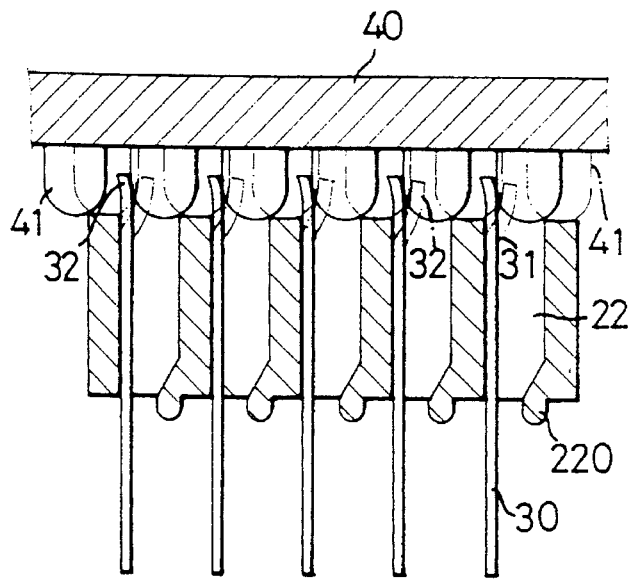
FIG. 4 is an enlarged fragmentary cross-sectional view corresponding to FIG. 3 showing the relative movement of the pins of the IC chip and the legs of the socket.
Figure 5:
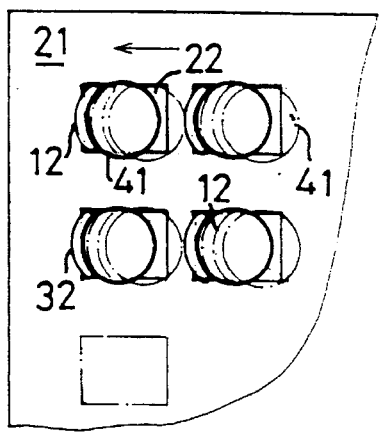
FIG. 5 is an enlarged fragmentary top view corresponding to FIG. 4 showing the relationship between the pins of the IC chip and the legs of the socket.

Referring to FIGS. 4 and 5, along with this sliding movement of the chip 40, the ball-shaped pins 41 are moved from a disconnecting position (as shown in phantom lines) to a contacting position (as shown in solid lines) to make a electrical surface contact with the arcuate surface 32 and deflect the bent portion 31 to a substantially upright position such that the electrical surface contact between the ball-shaped pins 41 and the contacting legs 30 is more firmly ensured because of the elastic returning force of the deflected bent portion 31.

Figure 6:
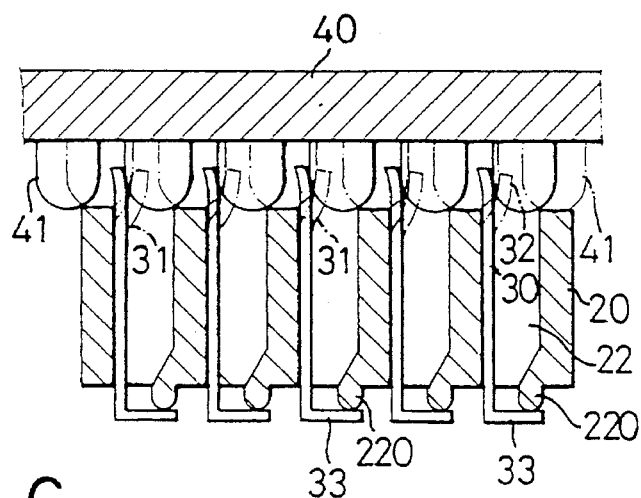
FIG. 6 is an enlarged fragmentary cross-sectional view similar to FIG. 4 showing another embodiment of the present invention.

Referring now to FIG. 6, according to another embodiment of the present invention, each of the contacting legs 30 comprises a deflection portion 33 at its second end thereof and each of said through holes 22 comprises a ridge 220 formed at a bottom of a side wall defining said through hole 22 to cooperate with said deflection portion 33 to position the contacting leg 30.

Although the invention has been explained in relation to its preferred embodiments, it is to be understood that many other possible modifications and variations can be made without departing from the spirit and scope of the invention as hereinafter claimed.

I claim:

1. A socket for receiving an IC chip having ball-shaped pins comprising a base, a sliding cover housing the base and an actuating rod located between the base and the cover for causing a sliding movement of the cover relative to the base, the socket being characterized in that:

the cover has a central opening for permitting the IC chip to be inserted therethrough, and an urging element located at one side of the opening which is perpendicular to a direction of the sliding movement of the cover for pushing a heat sink affixed on the IC chip to thereby cause the IC chip to move relative to the base;

the base has a plurality of through holes defined therein and arranged in a form of a matrix aligning with the opening of the cover, and a catching means disposed at one end of the base which is opposite to the urging element for cooperating with the urging element to hold the IC chip in a contacting position; and each of the through holes has a contacting leg disposed therein, the contacting leg having a first end extending beyond an upper face of the base and a second end extending through a bottom surface of the base, said first end having an arcuate surface which is perpendicular to the sliding movement of the IC chip and has a curvature equal to that of the ball-shaped pin of the IC chip so as to make an electrical surface contact with the ball-shaped pin when the IC chip is moved to the contacting position.

2. The socket as claimed in claim 1 wherein said contacting leg comprises a bent portion adjacent to said first end thereof for increasing its resiliency to assure said electrical surface contact.

3. The socket as claimed in claim 1 wherein said contacting leg comprises a deflection portion at its second end and each of said through holes comprises a ridge formed at a bottom of a side wall defining said through hole to cooperate with said deflection portion to position the contacting leg.

4. The socket as claimed in claim 1 wherein the base comprises positioning poles located at corners of the bottom surface thereof to position the socket.

* * * * *